US011437972B2

(12) United States Patent
Sadler et al.

(10) Patent No.: US 11,437,972 B2
(45) Date of Patent: Sep. 6, 2022

(54) ULTRA-BROAD BANDWIDTH MATCHING TECHNIQUE (71) Applicant: MACOM Technology Solutions Holdings, Inc., Lowell, MA (US)

(72) Inventors: Robert Sadler, Raleigh, NC (US); David Runton, Cary, NC (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 20 days.

(21) Appl. No.: 17/085,174

(22) Filed: Oct. 30, 2020

(65) Prior Publication Data

US 2021/0050838 A1    Feb. 18, 2021

Related U.S. Application Data (63) Continuation of application No. 15/130,900, filed on Apr. 15, 2016, now abandoned.

(51) Int. Cl.
*H03H 7/38*    (2006.01)

(52) U.S. Cl.
CPC ............. *H03H 7/38* (2013.01); *H03H 7/383* (2013.01)

(58) Field of Classification Search
CPC ............. H03H 7/38; H03H 7/40; H03H 7/383
USPC ............................................. 333/32, 33, 34
See application file for complete search history.

(56) References Cited

U.S. PATENT DOCUMENTS

| 7,071,498 | B2 | 7/2006 | Johnson et al. |
| 7,135,720 | B2 | 11/2006 | Nagy et al. |
| 7,247,889 | B2 | 7/2007 | Hanson et al. |
| 7,586,720 | B1 | 9/2009 | Ozard |
| 8,310,305 | B1 | 11/2012 | Cripe et al. |
| 9,064,775 | B2 | 6/2015 | Weeks, Jr. et al. |
| 9,722,032 | B2 | 8/2017 | Nagy et al. |
| 9,806,159 | B2 | 10/2017 | Nagy et al. |
| 9,935,581 | B2 * | 4/2018 | Takagi ...................... H03F 3/19 |
| 2002/0097110 | A1 | 7/2002 | Khan et al. |
| 2003/0030504 | A1 | 2/2003 | Dixit et al. |
| 2004/0000961 | A1* | 1/2004 | Killen ................... H01P 1/2135 |
| | | | 333/33 |
| 2007/0024371 | A1 | 2/2007 | Gotou et al. |

(Continued)

FOREIGN PATENT DOCUMENTS

| EP | 1750298 A2 | 2/2007 |
| EP | 2937995 A1 | 10/2015 |

OTHER PUBLICATIONS

CASPERS, RF engineering basic concepts: the Smith chart. CERN Yellow Report. Jan. 2012: 1-22.

(Continued)

*Primary Examiner* — Stephen E. Jones
(74) *Attorney, Agent, or Firm* — Perilla Knox & Hildebrandt LLP.; Jason M. Perilla (57) ABSTRACT A multicomponent network may be added to a transmission line in a high-frequency circuit to transform a first impedance of a downstream circuit element to second impedance that better matches the impedance of an upstream circuit element. The multicomponent network may be added at a distance more than one-quarter wavelength from the downstream circuit element, and can tighten a frequency response of the impedance-transforming circuit to maintain low Q values and low VSWR values over a broad range of frequencies.

24 Claims, 5 Drawing Sheets

(56) References Cited

U.S. PATENT DOCUMENTS

| | | |
|---|---|---|
| 2008/0315392 A1 | 12/2008 | Farrell et al. |
| 2009/0237166 A1 | 9/2009 | Gotou et al. |
| 2011/0148529 A1 | 6/2011 | Besling et al. |
| 2011/0298535 A1 | 12/2011 | Van Rijs et al. |
| 2013/0106519 A1 | 5/2013 | Kamiyama et al. |
| 2014/0354356 A1 | 12/2014 | Lizarraga |
| 2015/0280685 A1* | 10/2015 | Goumas ............ H03H 7/383 333/35 |
| 2016/0086878 A1 | 3/2016 | Otremba et al. |
| 2017/0104073 A1 | 4/2017 | Nagy et al. |
| 2017/0104075 A1 | 4/2017 | Nagy et al. |
| 2018/0083105 A1 | 3/2018 | Nagy et al. |

OTHER PUBLICATIONS

International Search Report for Application No. PCT/US2017/021746 dated Jun. 23, 2017.

Shor, Broadbanding techniques for TEM N-way power dividers. IEEE International Microwave Symposium. 1988: 657-9.

Extended European Search Report for Application No. EP 16190615.1 dated Mar. 8, 2017.

[No Author Listed], Gallium Nitride 48V, 100W, DC-2.2 GHz HEMT: Built Using the SIGANTIC Process—A proprietary GaN-on-Silicon technology. Nitronex. NPT2010. 2013. Accessed Feb. 23, 2017. 1-10.

[No Author Listed], GaN Wideband Transistor 48 V, 50 W DC-3.5 Ghz. Macom Technology Solutions Inc. NPT2020. Accessed Feb. 23, 2017. Available at: https://cdn.macom.com/datasheets/NPT2020.pdf. 13 pages.

Jantarachoie et al., Frequency band and operating class reconfigurable GaN HEMT power amplifier for sustainable wireless communications and energy applications. The 20th Asia-Pacific Conference on Communication (APCC). 2014: 156-60.

Victor et al., Voltage controlled GaN-on-Si HFET power oscillator using thin-film ferroelectric varactor tuning. Proceedings of the 36th European Microwave Conference Sep. 2006; 87-90.

Written Opinion for Application No. PCT/US2017/021746, dated Jun. 26, 2018.

Ch. II International Preliminary Report on Patentability for International Application No. PCT/US2017/021746, dated Oct. 17, 2018.

* cited by examiner

ULTRA-BROAD BANDWIDTH MATCHING TECHNIQUE

CROSS-REFERENCE TO RELATED APPLICATIONS

This application is a continuation of U.S. patent application Ser. No. 15/130,900, titled "ULTRA-BROAD BANDWIDTH MATCHING TECHNIQUE," filed Apr. 15, 2016, the entire contents of which is hereby incorporated herein by reference.

BACKGROUND

Technical Field

The technology relates to impedance-matching networks for high-frequency and ultra-broad bandwidth devices.

Discussion of the Related Art

Impedance matching is carried out for high-speed circuits to improve power transfer between circuit components, improve circuit performance, and reduce unwanted power reflections. Often, impedance matching involves a process of transforming an impedance at a first location in a circuit to a different value that matches an impedance at a second location in a circuit. For example, a load (e.g., an antenna) may have a first impedance that is different from an output impedance of a source (e.g., a signal generator). A circuit designer may add elements (e.g., capacitors, inductors, transmission line, or other components) between the load and source, so as to "transform" the impedance of the load. The added elements present a different impedance to the source that, when selected properly, match an output impedance of the source.

SUMMARY

Circuits and methods for transforming impedances in high-frequency circuits are described. The techniques may be used to match impedances over ultra-broad bandwidths (e.g., bandwidths greater than about 800 MHz). Lumped elements may be added to a circuit at distances greater than approximately one-quarter wavelength from the element for which an impedance is being transformed to obtain impedance matching over an ultra-broad bandwidth. The lumped elements may include passive components such as inductors and capacitors arranged in a network. The impedance-matching techniques may improve a matched bandwidth by more than 40% compared to conventional techniques.

According to some embodiments, an impedance-transforming circuit may be configured to operate at frequencies between 500 MHz and 6 GHz. An impedance-transforming circuit may comprise a multicomponent network integrated on a substrate and at least one transmission line configured to connect between the multicomponent network and a circuit element such that the multicomponent network is at least one-quarter wavelength from the circuit element. The multicomponent network and the at least one transmission line may be configured to transform an input impedance of the circuit element, so that a reduced voltage-to-standing-wave ratio (VSWR) (compared to a circuit that does not include the impedance-transforming circuit) is provided over a bandwidth that lies at least partly within the frequencies.

In some implementations, the substrate may comprise a printed circuit board or pallet. In other implementations, the substrate may comprise one or more semiconductor chips (e.g., chips of a multi-chip module). In some aspects, the reduced VSWR is less than or approximately equal to 2. In some cases, the reduced VSWR is less than or approximately equal to 2 and the bandwidth is between 1 GHz and 2 GHz.

In some implementations, the reduced VSWR is less than or approximately equal to 2 and the bandwidth is centered at approximately 750 MHz and has a width between approximately 325 MHz and approximately 750 MHz. In some implementations, the reduced VSWR is less than or approximately equal to 2 and the bandwidth is centered at approximately 2.2 GHz and has a width between approximately 1.1 GHz and approximately 2.2 GHz. According to some aspects, the reduced VSWR is less than or approximately equal to 2 and the bandwidth is centered at approximately 2.7 GHz and has a width between approximately 1.3 GHz and approximately 2.7 GHz. Yet, in other implementations, the reduced VSWR is less than or approximately equal to 2 and the bandwidth is centered at approximately 3.8 GHz and has a width between approximately 1.9 GHz and approximately 3.8 GHz.

In some implementations of an impedance-transforming circuit, a multicomponent network comprises at least two passive circuit elements. In some aspects, a multicomponent network comprises a three-element 7C network. According to some implementations, a multicomponent network comprises a T network. In some implementations, a multicomponent network comprises an LCC network. In yet other aspects, the at least one transmission line of an impedance-transforming circuit comprises two transmission line sections having different impedances.

Some implementations may further include a source having an output impedance at an output that is connected to the impedance-transforming circuit, wherein the reduced VSWR is less than or approximately equal to 2 and the bandwidth is greater than 800 MHz. Some implementations may further comprise a source connected to the multicomponent network, wherein the source comprises a gallium-nitride amplifier. Some implementations may further comprise a source connected to the multicomponent network, wherein the source is included in a wireless communication device.

Some embodiments relate to methods of operating a device having an impedance-transforming circuit. The impedance-transforming circuit may include any of the foregoing aspects and implementation. In some embodiments, a method for transforming an impedance of a circuit element in a high-frequency circuit may comprise acts of receiving a signal having a frequency component between 500 MHz and 6 GHz at a multicomponent network; providing the signal from the multicomponent network to at least one transmission line; providing the signal from the at least one transmission line to the circuit element, wherein the multicomponent network is at least one-quarter wavelength from the circuit element; and transforming, by the multicomponent network and the at least one transmission line, the input impedance of the circuit element to provide a reduced VSWR over a bandwidth.

In some aspects, a method for transforming an impedance may comprise reflecting a voltage amount from the multicomponent network less than or equal to one-half of an incident voltage over a bandwidth greater than 800 MHz. In some implementations, a method may comprise reflecting a voltage amount from the multicomponent network less than or equal to one-half of an incident voltage over a bandwidth that is between about 1 GHz and about 2 GHz. Some method implementations may further include generating a signal that is received at the multicomponent network with a gallium-nitride amplifier. Some implementations may include using the impedance-transforming circuit to transmit a signal wirelessly.

The foregoing apparatus and method embodiments may be included in any suitable combination with aspects, features, and acts described above or in further detail below. These and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures. Where the drawings relate to microfabricated circuits, only one device and/or circuit may be shown to simplify the drawings. In practice, a large number of devices or circuits may be fabricated in parallel across a large area of a substrate or entire substrate. Additionally, a depicted device or circuit may be integrated within a larger circuit.

When referring to the drawings in the following detailed description, spatial references "top," "bottom," "upper," "lower," "vertical," "horizontal," "above," "below" and the like may be used. Such references are used for teaching purposes, and are not intended as absolute references for embodied devices. An embodied device may be oriented spatially in any suitable manner that may be different from the orientations shown in the drawings. The drawings are not intended to limit the scope of the present teachings in any way.

Features and advantages of the illustrated embodiments will become more apparent from the detailed description set forth below when taken in conjunction with the drawings.

DETAILED DESCRIPTION

Impedance matching can be important in the area of high-frequency electronics associated with signal communications (e.g., radio-frequency (RF) communications), radar, and microwave applications. In such applications, impedance matching can reduce signal noise, increase power efficiency of battery-operated devices (e.g., mobile communication devices), improve gain and/or linearity of amplifiers, and reduce power reflections in high-power circuits that might otherwise damage or interfere with signal generators. Some of these applications may utilize gallium-nitride-based transistors arranged in amplifier circuits, or other high-frequency transistors that operate at multi-giga-Hertz frequencies. Impedance matching may be employed in these amplifier circuits to increase their gain-bandwidth product and improve drain efficiency among other figures-of-merit for high-frequency transistors arranged in amplifier circuits.

Conventionally, there are a wide variety of ways to transform an impedance at a node in a circuit to a different impedance that may be a better match to an element or source connected to the node. Some impedance-matching techniques employ lumped elements, microstrip transmission lines, ferrite transformers, and other devices that are added to the node in close proximity to the node (e.g., less than about one-quarter wavelength of a signal or carrier wave from the node). These elements can transform the impedance of the node over a frequency bandwidth that is limited by a resonance characteristic or Q of the resulting circuit. Conventional wisdom has been that any elements added for impedance transformation purposes to a node should be added within one-quarter wavelength of the node. Beyond this distance, it was thought that impedance transformation would be ineffective.

The inventor has recognized and appreciated that lumped circuit elements may be added in a network at distances beyond one-quarter wavelength and surprisingly improve impedance matching over bandwidths broader than those achieved with conventional techniques. In some practical applications, it may not be easy to access a node and add lumped elements within a quarter wavelength of the node to transform an impedance of the node. According to some embodiments described herein, a three-component network comprising passive circuit elements may be added at the end of a transmission line that is coupled to a node to transform an impedance of the node, and the transmission line may extend beyond one-quarter wavelength from the node. Some embodiments may contain fewer or more passive circuit elements. Impedance matching with a voltage-to-standing-wave ratio (VSWR) of less than 2:1 over bandwidths greater than 800 MHz and as wide as approximately 3 GHz, or even wider, may be achieved using the techniques described herein.

The phrases "impedance matching," "match the impedance," or "match impedances reasonably well" may be used to refer to instances where the impedances of two connected circuit elements are matched to an extent that a VSWR at a connection between the two elements is equal to or less than approximately 2:1. Circuit elements with matched impedances may have approximately equal or identical impedance values in some cases, but, in other cases, need not have identical impedance values.

Impedance-matching circuits and techniques described herein may be useful for high-frequency devices and circuits such as those used in RF communications, radar, microwave applications as well as lower frequency amplifiers. In these applications, amplifiers comprising gallium-nitride transistors may be used to provide signal amplification at frequencies from about 30 MHz up to about 6 GHz, although the impedance-transforming networks are not limited to only these applications, gallium-nitride transistors, and frequencies. In some implementations, the amplifiers may be integrated into a circuit (e.g., a printed circuit board (PCB) or a pallet), and an impedance-transforming network may be integrated onto the PCB or pallet. For example, an impedance-transforming network may be connected to a transmission line that is connected to an input and/or output of a high-frequency amplifier. In some implementations, an impedance-matching circuit of the present embodiments may be connected between an amplifier and an antenna in a signal transmitter of a wireless communication device, and may be used to transmit a signal wirelessly. In some cases, an impedance-transforming network may improve the drain efficiency and bandwidth performance of an amplifier to which it is connected. Impedance-transforming networks may also be used in multi-chip modules to match impedances of devices on one or more chips.

Impedance-transforming circuits of the present embodiments may be included in various types of electronic circuits and circuit assemblies. For example, an impedance-transforming circuit may be included in co-fired ceramic assemblies, such as low-temperature co-fired ceramic (LTCC) assemblies, according to some embodiments. Such an assembly may include LTCC passive elements (e.g., capacitors, inductors) as part of an impedance-transforming circuit. Other embodiments of an impedance-transforming circuit may include, but are not limited to, silicon substrates and/or passive components, gallium-arsenide substrates and/or passive components, and gallium-nitride substrates and/or passive components. An impedance-transforming circuit of the present embodiments may be included in an active die (e.g., a microwave monolithic integrated circuit—MMIC), or may be included on a separate die coupled to an active die in a multi-die or multi-chip module.

Figure 1:
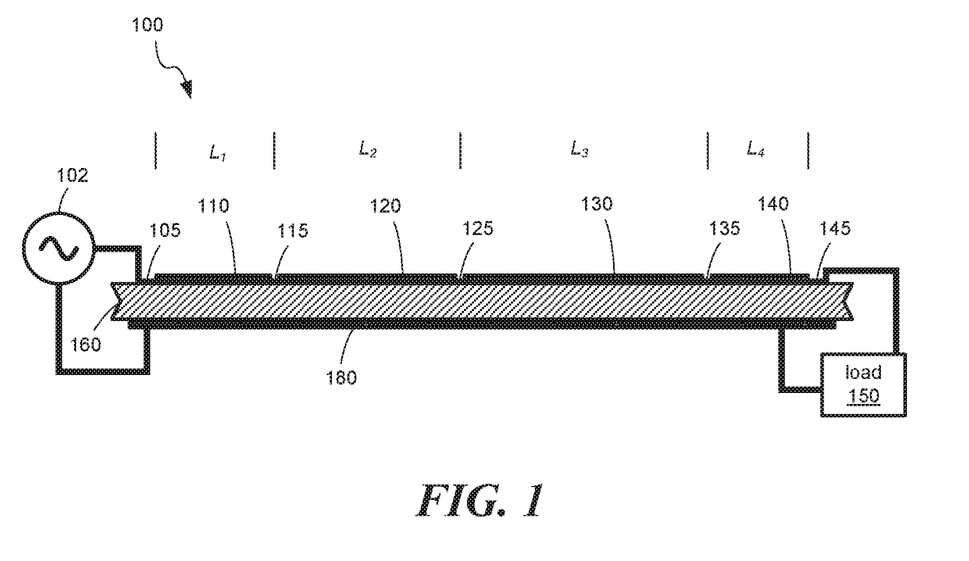
FIG. 1 depicts sections of transmission line that may be used to transform an impedance of a load.

An example of an impedance-transforming circuit 100 is depicted in FIG. 1, which illustrates sections of transmission lines 110, 120, 130, 140 connected between a load 150 and a source 102. One way to transform the impedance of a load 150 so that it matches an output impedance of a source is to connect a customized transmission line between the two circuit components. In some embodiments, the load may be an antenna and have a low impedance, whereas the source may comprise an RF amplifier and have an output impedance of approximately 50 ohms. Other types of loads and sources having different impedances from these values may be used in other embodiments.

The transmission line sections may be formed as microstrip transmission lines (e.g., formed as conductive strips on a printed circuit board) which have different impedance characteristics. In this example, the four transmission line sections 110, 120, 130, 140 may have four different impedance characteristics, and be connected at plural connection points 115, 125, 135. According to some embodiments, the sections of transmission line may be formed on a PCB that is approximately 25 mils thick and has a dielectric constant $E_r$ of approximately 10.2.

A numerical simulation was carried out to evaluate impedance transformation along transmission line sections, such as those depicted in FIG. 1. For the simulation, a first transmission line section 110 comprised a copper microstrip line having a length $L_1$ of approximately 6.5 mm and a width of approximately 0.5 mm. The second transmission line section 120 comprised a copper microstrip line having a length $L_2$ of approximately 15.1 mm and a width of approximately 1.5 mm. The third transmission line section 130 comprised a copper microstrip line having a length $L_3$ of approximately 12.7 mm and a width of approximately 5.3 mm. The fourth transmission line section 140 comprised a copper microstrip line having a length $L_4$ of approximately 9.1 mm and a width of approximately 14.5 mm. Examples of simulations tools that may be used to analyze the circuit include, but are not limited to, Advanced Design System (ADS) available from Keysight EEsof EDA of Santa Rosa, Calif., and Microwave Office (MWO) available from National Instruments of El Segundo, Calif. Some simulations may be done using a version of SMITH32, previously available from Motorola of Schaumburg, Ill.

Figure 2:
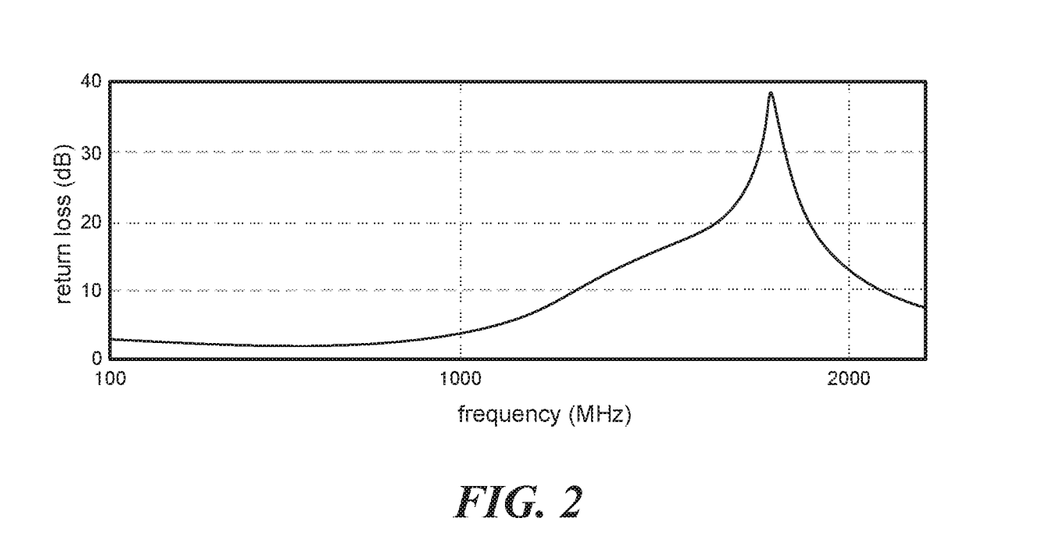
FIG. 2 illustrates return loss calculated for the circuit of FIG. 1 as a function of frequency.

Values of return loss were computed as a function of frequency for the impedance-transforming structure shown in FIG. 1 and having the PCB characteristics and transmission line dimensions described above. A graph of return loss for the structure is plotted in FIG. 2, and shows a resonance behavior with a peak at about 1.8 GHz. The return loss represents an amount of power provided from the signal generator 102 to the load 150 divided by an amount of power reflected back from the impedance-transforming circuit comprised of transmission lines. A high value of return loss indicates that the source 102 is better matched to the impedance-transforming circuit. From the graph of return loss, values of voltage-to-standing-wave-ratio can be computed. It is found that a bandwidth for which the VSWR is less than approximately 2:1 extends from approximately 1.28 GHz to approximately 2.08 GHz, a bandwidth of approximately 800 MHz with a center at approximately 1.7 GHz.

Figure 3:
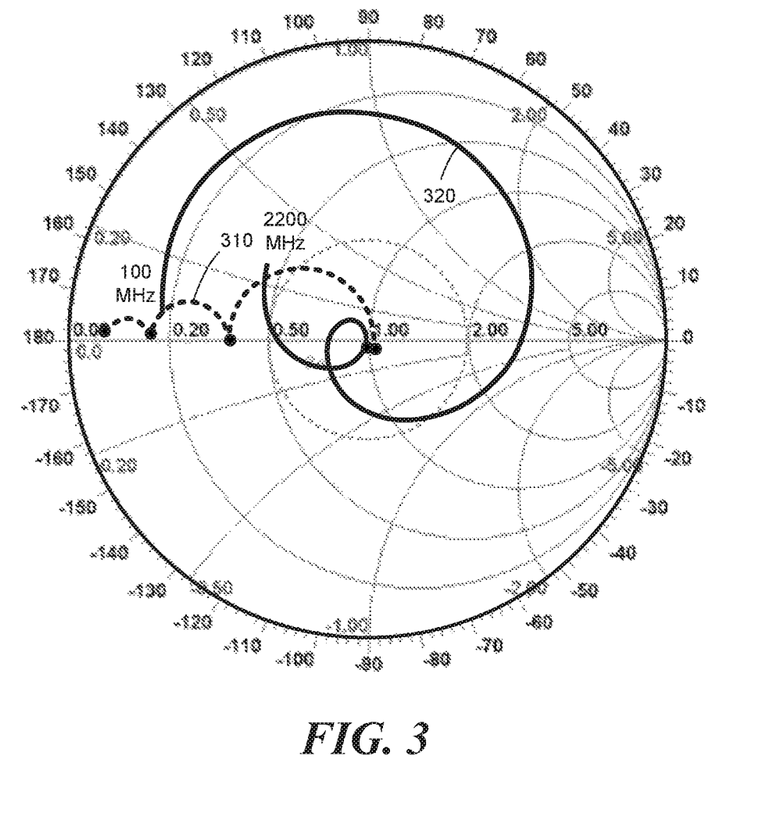
FIG. 3 is a Smith chart that plots impedance values along the sections of transmission line of FIG. 1 and impedance seen by the generator as a function of frequency.

Impedance values for the impedance-transforming circuit 100 were also calculated, and are plotted on the Smith chart of FIG. 3. In a first set of calculations, illustrated as the dotted curve 310, impedance values were computed along the transmission line sections between the load 150 and the source 102. The solid dots indicate the locations of the nodes 105, 115, 125, 135, 145. These values were computed for a fixed frequency of approximately 1.8 GHz. From these calculations, it can be seen that the impedance value starts from a low value at the left side of the Smith chart (corresponding to the load impedance) and increases to a value of approximately 50 ohms at the center of the Smith chart, which provides a better impedance match to the signal generator 102. The impedance values of dotted curve 310 proceed through an inductive region of the Smith chart.

Also shown on the Smith chart in FIG. 3 are impedance values calculated as a function of frequency for the impedance-transforming circuit 100. These values are shown as the solid line 320 in the drawing. This curve shows that the impedance generally follows a spiral path from a low-frequency of 100 MHz at the left side of the Smith chart to a high-frequency of 2200 MHz. Near the resonance frequency, the impedance of the impedance-transforming circuit nearly matches the impedance of the source 102.

Although the impedance-transforming circuit 100 depicted in FIG. 1 can provide impedance transformation and reasonable impedance matching over a range of frequencies, the inventor has recognized and appreciated that the addition of a lumped element network at the end of the transmission line can improve the bandwidth over which impedances can be matched, even if the lumped element is more than one-quarter wavelength from the circuit element for which impedance is to be transformed. An example of an improved impedance-transforming circuit is depicted in FIG. 4.

According to some embodiments, an impedance-transforming circuit 400 may comprise two or more sections of transmission line T1, T2, T3, T4 and a multicomponent impedance-matching network 405. The sections of the transmission line may be different from each other in some embodiments, or may be identical sections in other embodiments. The sections of transmission line may be connected electrically at nodes 412, 413, 414. The transmission line sections may extend more than one-quarter wavelength beyond a node 411 at which an impedance is to be transformed to a matching impedance at a desired frequency.

A multicomponent network 405 may include passive components, such as inductors, capacitors, resistors, diodes, and ferrite transformers. According to some implementations, a multicomponent network 405 may comprise a pi network (π network) that includes a first shunt capacitor C1 connected in parallel with a second shunt capacitor C2 and an inductor L1 connected between the first and second capacitors C1, C2. The inductor may be connected in series with the transmission line sections. According to some embodiments, a multicomponent network 405 may be located at a distance from a load 150 or other element that is greater than one-quarter wavelength of a frequency for which impedance matching is desired. In some embodiments, the multicomponent network 405 may be located between approximately ¼ wavelength and approximately ¾ wavelength from a load or other element for which impedance matching is desired.

Figure 4:
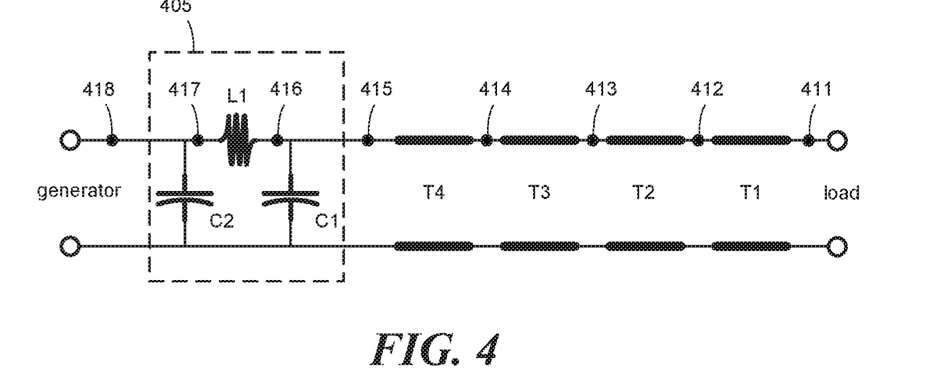
FIG. 4 depicts circuitry for transforming an impedance of a load, according to some embodiments.

Numerical simulations were carried out for the impedance-transforming circuit 400 of FIG. 4. For the simulations the sections of the transmission line T1, T2, T3, T4 comprised microstrip transmission lines. The first section T1 had a length of approximately 12.3 millimeters and a width of approximately 14.6 millimeters. The second section T2 had a length of approximately 19.1 millimeters and a width of approximately 7.7 millimeters. The third section T3 had a length of approximately 18.8 millimeters and a width of approximately 3.2 millimeters. The fourth section T4 had a length of approximately 5.4 millimeters and a width of approximately 0.5 millimeters. The PCB had a thickness of approximately 0.63 mm and a dielectric constant $E_r$ of approximately 10.2. A capacitance of the first capacitor C1 was approximately 2.7 pF and a capacitance of the second capacitor C2 was approximately 1.4 pF. The value of the inductor L1 was approximately 2.6 nH. In some embodiments, a capacitance of the first capacitor C1 may be between approximately 0.5 pF and approximately 10 pF. In some embodiments, a capacitance of the second capacitor C2 may be between approximately 0.5 pF and approximately 5 pF. A value of the inductor L1 may be between approximately 0.5 nH and approximately 10 nH.

Figure 5:
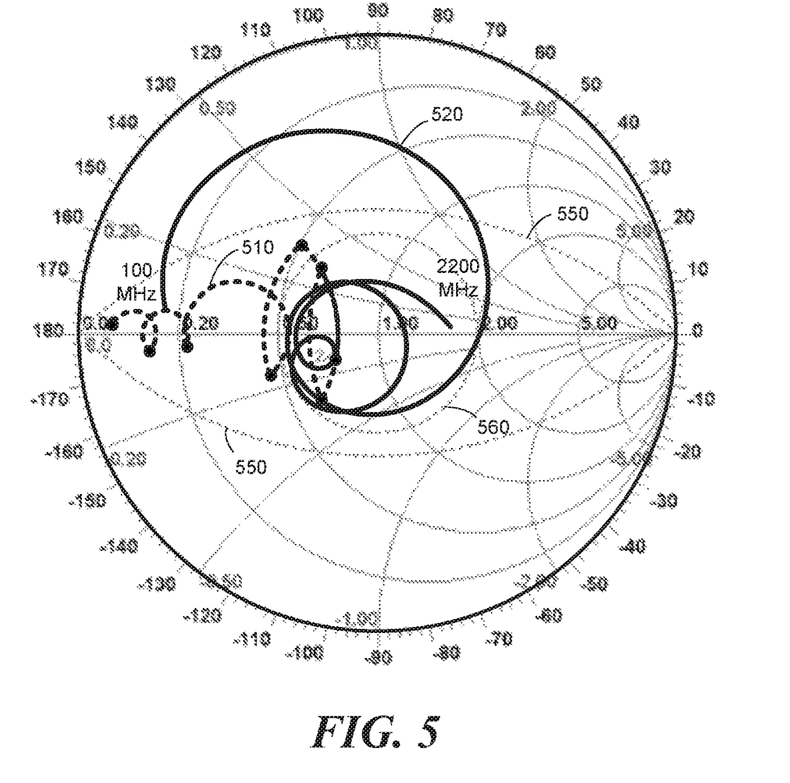
FIG. 5 is a Smith chart that plots impedance values along the circuit of FIG. 4 and impedance seen by the generator as a function of frequency, according to some embodiments.

Impedance values were computed for the impedance-transforming circuit of FIG. 4, and are plotted in the Smith chart of FIG. 5. In a first set of calculations, impedance values were calculated at a fixed frequency of approximately 1.8 GHz along the impedance-transforming circuit 400, beginning at the load and working toward the generator. These impedance values are shown as the dashed line 510 in the Smith chart. The locations of the nodes 411, 412, 413, 414, 415, 416, 417, 418 are indicated as solid dots on the curve. The impedance values at the load end (low impedance) begin on the left side of the Smith chart, and the impedance increases to less than about 50 ohms. Unlike the case for the four transmission line sections plotted in FIG. 3, the impedance values along the impedance-transforming circuit 400 traverse a similar region of the Smith chart, but now oscillate between inductive and capacitive impedances along the circuit.

Also plotted on the Smith chart, as solid line 520, are the impedance values seen at the generator for the impedance-transforming circuit 400 as a function of frequency. For this calculation the frequency was stepped from approximately 100 MHz to 2.2 GHz in increments of approximately 19 MHz. The impedance trajectory as a function of frequency begins at a low impedance value toward the left side of the Smith chart and spirals in to a value that reasonably well matches the impedance of the generator. Also plotted in FIG. 5 is a circle 560 for which the magnitude of the reflection coefficient is constant. According to some embodiments, circle 560 represents a region for which the VSWR for the impedance-transforming circuit 400 is less than or equal to 2.

In comparison with the Smith chart of FIG. 3, it can be seen that the addition of the multicomponent network 405 tightens the frequency response (spiral trajectory) of the impedance-transforming circuit 400 over a range of high frequencies. Although the impedance trajectory traverses a similar impedance zone on the Smith chart to that of FIG. 3, the impedance values at the higher frequencies stay within the reflection coefficient circle 560 over a larger range of frequencies. Therefore, the VSWR remains below 2 over a broader bandwidth than can be achieved with the transmission-line impedance-transforming circuit 100 of FIG. 1.

Also plotted in FIG. 5 are the Q=1 lines 550. The impedance trajectory of the impedance-transforming circuit 400 stays within the Q=1 line over a larger range of frequencies. This indicates that the multicomponent network 405 helps maintain a low-Q value for the impedance-transforming circuit. By extending a low-Q value over a larger range of frequencies, it is possible to provide better impedance matching over a broader bandwidth. In some implementations, discrete transistors may have high-Q values and high reactive impedances, which can limit the bandwidth of conventional impedance-matching networks added to the transistor at its input and/or output. According to some embodiments, a multicomponent network 405 may be added to a transmission line connected to the transistor, more than a quarter wavelength from the transistor, and improve the bandwidth over which impedances are reasonably well matched to within an acceptable level (e.g., a VSWR less than about 2).

In some implementations, a multicomponent network 405 and at least one transmission line may be used to transform a first impedance of a downstream circuit element (e.g., a load) to match a second predetermined impedance of an upstream circuit element (e.g., a signal source). The multicomponent network and at least one transmission line may be configured to operate at one or more frequencies of at least 1 GHz, according to some embodiments. In some embodiments, a predetermined impedance of an upstream circuit element may be between approximately 25 ohms and 100 ohms. In some cases, a predetermined impedance of an upstream circuit element may be approximately 50 ohms or approximately 75 ohms. In some implementations, the matching may further extend over a range of frequencies, such that the transformed impedances provide a VSWR less than approximately 2 between the source and impedance-transforming circuit.

Figure 6:
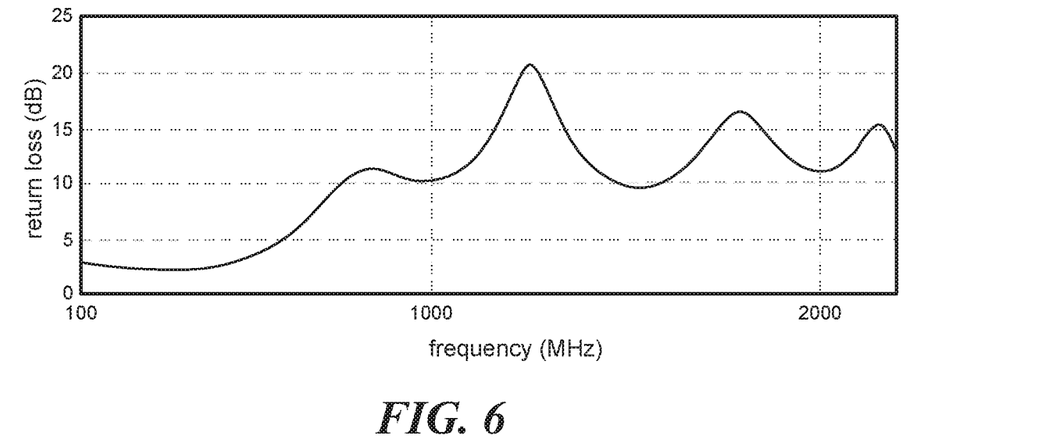
FIG. 6 illustrates return loss calculated for the circuit of FIG. 4 as a function of frequency, according to some embodiments.

Return loss values were also computed for the impedance-transforming circuit 400 of FIG. 4, and the results are shown in FIG. 6. The plot shows several resonant peaks of lower amplitude and broader width than was the case for the impedance-transforming circuit 100 of FIG. 1. As a result, the bandwidth over which the impedance is reasonably well matched to the source extends from approximately 750 MHz to over 2.2 GHz, over a bandwidth of approximately 1.5 GHz. The bandwidth over which the impedance is reasonable well matched has a center frequency at approximately 1.5 GHz. The bandwidth over which impedances are reasonably well matched is approximately ±50% of the center frequency. The addition of the multicomponent network 405 increases the impedance-matched bandwidth (compare FIG. 2) by more than 80% compared to a transmission line impedance-transforming circuit 100, as in FIG. 1.

The impedance-matching techniques may be used for other or specific frequency ranges and other impedance values. For example, the lengths and impedance of transmission line sections and values of capacitive and inductive components in a multicomponent network may be selected to match impedances reasonable well over broad bandwidths at frequencies as low as 30 MHz and as high as 6 GHz. Impedances that are matched reasonable well may provide a VSWR less than or approximately equal to 2. In some implementations, transmission line sections and values of capacitive and inductive components may be selected to match impedances reasonably well over a bandwidth centered at approximately 750 MHz. In some implementations, transmission line sections and values of capacitive and inductive components may be selected to match impedances reasonably well over a bandwidth centered at approximately 2.2 GHz. In some embodiments, transmission line sections and values of capacitive and inductive components may be selected to match impedances reasonably well over a bandwidth centered at approximately 2.7 GHz. In some embodiments, transmission line sections and values of capacitive and inductive components may be selected to match impedances reasonably well over a bandwidth centered at approximately 3.8 GHz. For each of these center frequencies, the bandwidth over which the impedance provides a VSWR less than or about equal to 2 may be between approximately ±25% and approximately ±50% of the center frequency.

Although FIG. 4 shows one embodiment of a multicomponent network 405 that can be used in an impedance-transforming circuit 400, other networks are contemplated. Some multicomponent networks may include fewer or more elements than are depicted in FIG. 4. For example some multicomponent networks may include only an inductor and a capacitor. In some embodiments, the multicomponent network 405 may include additional inductors and capacitors and other elements so that the total number of components may be between 3 and 10.

Figure 7A:
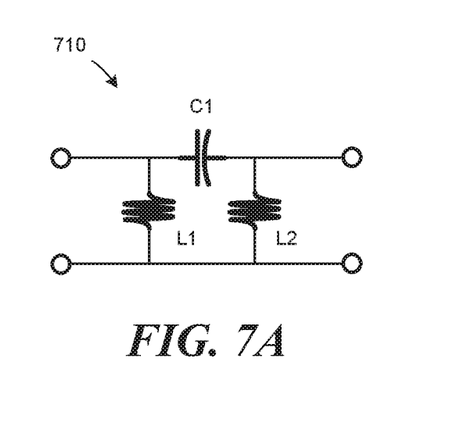
FIG. 7A depicts an alternate pi network that may be used to transform impedance of a load, according to some embodiments.

FIG. 7A depicts an alternative embodiment of a multicomponent network 710, which may be used in an impedance-transforming circuit. The embodiment shown in FIG. 7A may be referred to as a high-pass π network. This network may include a first inductor L1 and a second inductor L2 connected in a parallel shunt arrangement. The network may further include a capacitor C1 connected between ends of the first and second inductors and in series with a transmission line (not shown). In some embodiments, a capacitance of the first capacitor C1 may be between approximately 0.5 pF and approximately 10 pF. A value of the first inductor L1 may be between approximately 0.5 nH and approximately 10 nH. A value of the second inductor L2 may be between approximately 0.5 nH and approximately 10 nH.

Figure 7B:
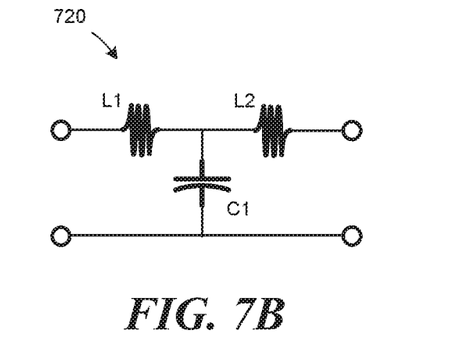
FIG. 7B depicts a T network that may be used to transform impedance of a load, according to some embodiments.

FIG. 7B depicts an alternative embodiment of a multicomponent network 720, which may be used in an impedance-transforming circuit. The embodiment shown in FIG. 7B may be referred to as a T network. According to some embodiments, a T network may include a first inductor L1 connected in series with a second inductor L2. The two inductors may be connected in series with a transmission line (not shown). The network may further include a shunt capacitor C1 connected to a node between the first inductor and second inductor, and further connected to a ground plane or ground conductor. In some embodiments, a capacitance of the shunt capacitor C1 may be between approximately 0.5 pF and approximately 10 pF. A value of the first inductor L1 may be between approximately 0.5 nH and approximately 10 nH. A value of the second inductor L2 may be between approximately 0.5 nH and approximately 10 nH.

Figure 7C:
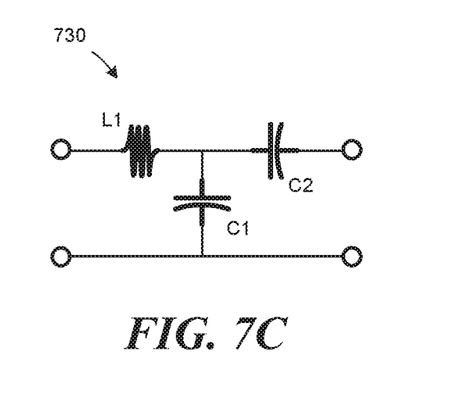
FIG. 7C depicts an LCC network that may be used to transform impedance of a load, according to some embodiments.

FIG. 7C depicts another embodiment of the multicomponent network 730, which may be used in an impedance-transforming circuit. The embodiment shown in FIG. 7C may be referred to as an LCC network. An LCC network 730 may include a first inductor L1 connected in series with a first capacitor C1. The first inductor and first capacitor may be connected in series with a transmission line (not shown). The network may further include a second capacitor C2 connected in a shunt arrangement to a node between the first inductor and the first capacitor and further connected to a ground conductor or ground plane. In some embodiments, a capacitance of the first capacitor C1 may be between approximately 0.5 pF and approximately 10 pF, and a value of the second capacitor C2 may be between approximately 0.5 pF and approximately 10 pF. A value of the first inductor L1 may be between approximately 0.5 nH and approximately 10 nH.

Figure 8:
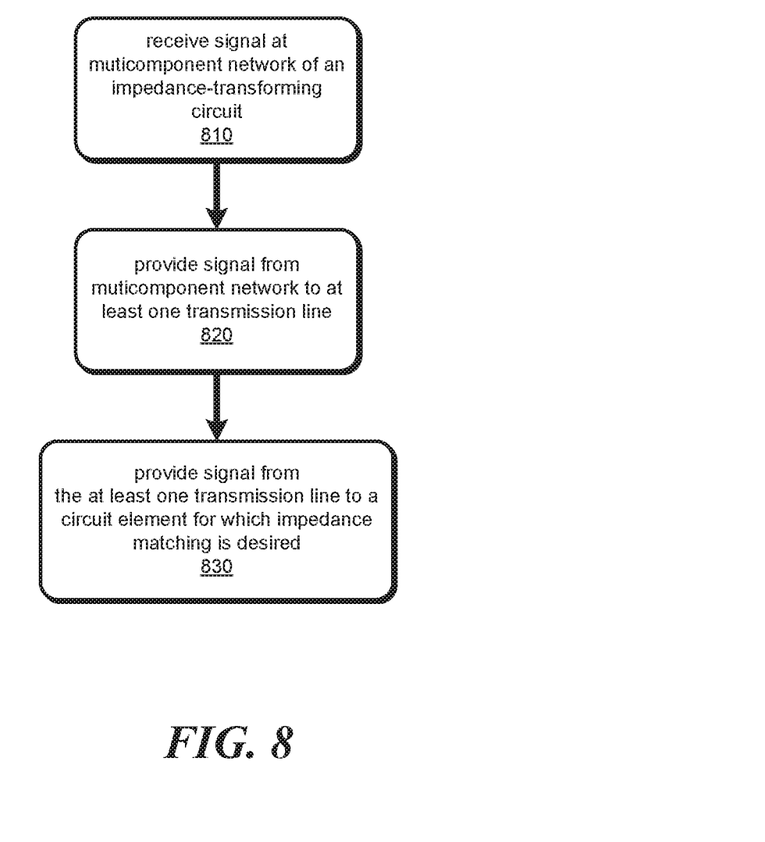
FIG. 8 depicts a method of operating a device that includes an impedance-transforming circuit, according to some embodiments.

Methods of operating devices with impedance-transforming circuits integrated in the devices are also contemplated by the inventor. According to some embodiments, a method 800 depicted in FIG. 8 may comprise transforming an impedance of an element in a high-frequency circuit that is configured to operate at a frequency between 500 MHz and 6 GHz. A method may comprise acts of receiving a signal (act 810) having a frequency component between 500 MHz and 6 GHz at a multicomponent network of an impedance-transforming circuit. A method may further include providing the signal (act 820) from the multicomponent network to at least one transmission line, and providing the signal (act 830) from the at least one transmission line to a circuit element. The received signal may be from any suitable signal source (e.g., a signal generator) that is connected to the multicomponent network. The multicomponent network and at least one transmission line may be connected to the circuit element, for which impedance matching to the source is desired over a range of frequencies. In various embodiments of the method 800, the multicomponent network may be at least one-quarter wavelength from the circuit element.

CONCLUSION

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

The technology described herein may be embodied as a method, of which at least some acts have been described. The acts performed as part of the method may be ordered in any suitable way. Accordingly, embodiments may be constructed in which acts are performed in an order different than described, which may include performing some acts simultaneously, even though described as sequential acts in illustrative embodiments. Additionally, a method may include more acts than those described, in some embodiments, and fewer acts than those described in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A circuit for impedance matching between a source and a load over a bandwidth comprising:
   at least one transmission line; and
   a multicomponent network comprising a plurality of passive circuit elements coupled to the at least one transmission line, wherein:
   the at least one transmission line separates the multicomponent network from the source by at least one quarter wavelength;
   the multicomponent network and the at least one transmission line maintain a voltage-to-standing-wave-ratio (VSWR) for the circuit under a value over at least the bandwidth; and
   an impedance value of the at least one transmission line oscillates between an inductive impedance and a capacitive impedance, as measured along a length of the at least one transmission line in the circuit for impedance matching.

2. The circuit for impedance matching according to claim 1, wherein the impedance value of the at least one transmission line oscillates between the inductive impedance and the capacitive impedance, as measured along a length of the at least one transmission line, to increase an impedance-matched bandwidth of a system including the circuit, as compared to a transmission line having an impedance that does not oscillate between inductive and capacitive impedances.

3. The circuit for impedance matching according to claim 1, wherein:
   the at least one transmission line comprises a plurality of transmission lines; and
   a first transmission line among the plurality of transmission lines oscillates between an inductive impedance and a capacitive impedance at least two times, as measured along a length of the first transmission line in the circuit for impedance matching.

4. The circuit for impedance matching according to claim 1, wherein:
   the at least one transmission line comprises a plurality of transmission lines; and
   an impedance value of each of the plurality of transmission lines oscillates between an inductive impedance and a capacitive impedance, as measured along a length of the transmission line in the circuit for impedance matching.

5. The circuit for impedance matching according to claim 1, wherein the multicomponent network and the at least one transmission line reduce return loss in the circuit for impedance matching over at least the bandwidth.

6. The circuit for impedance matching according to claim 1, wherein the multicomponent network and the at least one transmission line maintain a frequency response spiral trajectory of the circuit for impedance matching to within a reflection coefficient circle on a Smith chart over at least the bandwidth.

7. The circuit for impedance matching according to claim 1, wherein the multicomponent network increases a range of frequencies over which a frequency response of the circuit for impedance matching stays within a reflection coefficient circle on a Smith chart.

8. The circuit for impedance matching according to claim 1, wherein the at least one transmission line extends beyond one-quarter wavelength from the source.

9. The circuit for impedance matching according to claim 1, wherein the at least one transmission line extends greater than one-quarter wavelength and less than three-quarter wavelength from the source.

10. The circuit for impedance matching according to claim 1, wherein:
    the at least one transmission line comprises a plurality of transmission lines; and
    each of the plurality of transmission lines has a respective, different length other than one-quarter wavelength.

11. The circuit for impedance matching according to claim 1, wherein:
    the at least one transmission line comprises a plurality of transmission lines; and
    each of the plurality of transmission lines has a respective, different width.

12. The circuit for impedance matching according to claim 1, wherein the multicomponent network and the at least one transmission line maintain the VSWR for the circuit to less than or approximately equal to 2 over at least the bandwidth of greater than 800 Mhz.

13. The circuit for impedance matching according to claim 1, wherein the multicomponent network and the at least one transmission line maintain the VSWR for the circuit to less than or approximately equal to 2 over at least the bandwidth of between 1 GHz and 2 GHz.

14. The circuit for impedance matching according to claim 1, wherein the multicomponent network and the at least one transmission line maintain the VSWR for the circuit to less than or approximately equal to 2 over at least the bandwidth centered at approximately 750 MHz with a width between approximately 325 MHz and approximately 750 MHz.

15. The circuit for impedance matching according to claim 1, wherein the multicomponent network and the at least one transmission line maintain the VSWR for the circuit to less than or approximately equal to 2 over at least the bandwidth centered at approximately 2.2 GHz with a width between approximately 1.1 GHz and approximately 2.2 GHz.

16. The circuit for impedance matching according to claim 1, wherein the multicomponent network and the at least one transmission line maintain the VSWR for the circuit to less than or approximately equal to 2 over at least the bandwidth centered at approximately 2.2 GHz with a width between approximately 1.3 GHz and approximately 2.7 GHz.

17. A circuit for impedance matching between a source and a load over a bandwidth comprising:

at least one transmission line; and a multicomponent network, wherein the multicomponent network and the at least one transmission line maintain a voltage-to-standing-wave-ratio (VSWR) for the circuit under a value over at least the bandwidth, wherein:

an impedance value of the at least one transmission line oscillates between an inductive impedance and a capacitive impedance, as measured along a length of the at least one transmission line in the circuit for impedance matching.

18. The circuit for impedance matching according to claim 17, wherein the impedance value of the at least one transmission line oscillates between the inductive impedance and the capacitive impedance, as measured along a length of the at least one transmission line, to increase an impedance-matched bandwidth of a system including the circuit, as compared to a transmission line having an impedance that does not oscillate between inductive and capacitive impedances.

19. The circuit for impedance matching according to claim 17, wherein:

the at least one transmission line comprises a plurality of transmission lines; and a first transmission line among the plurality of transmission lines oscillates between an inductive impedance and a capacitive impedance at least two times, as measured along a length of the first transmission line in the circuit for impedance matching.

20. The circuit for impedance matching according to claim 17, wherein:

the at least one transmission line comprises a plurality of transmission lines; and an impedance value of each of the plurality of transmission lines oscillates between an inductive impedance and a capacitive impedance, as measured along a length of the transmission line in the circuit for impedance matching.

21. The circuit for impedance matching according to claim 17, wherein the multicomponent network and the at least one transmission line reduce return loss in the circuit for impedance matching.

22. The circuit for impedance matching according to claim 17, wherein the multicomponent network increases a range of frequencies over which a frequency response of the circuit for impedance matching stays within a reflection coefficient circle on a Smith chart.

23. The circuit for impedance matching according to claim 17, wherein:

the at least one transmission line comprises a plurality of transmission lines; and each of the plurality of transmission lines has a respective, different length other than one-quarter wavelength.

24. The circuit for impedance matching according to claim 17, wherein:

the at least one transmission line comprises a plurality of transmission lines; and each of the plurality of transmission lines has a respective, different width.

* * * * *